US006260282B1

(12) United States Patent
Yuan et al.

(10) Patent No.: US 6,260,282 B1
(45) Date of Patent: *Jul. 17, 2001

(54) STAGE CONTROL WITH REDUCED SYNCHRONIZATION ERROR AND SETTLING TIME

(75) Inventors: Bausan Yuan, San Jose, CA (US); Susumu Makinouchi; Hideyaki Hashimoto, both of Tokyo (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 10 days.

(21) Appl. No.: 09/049,801

(22) Filed: Mar. 27, 1998

(51) Int. Cl.$^7$ ............................. H01L 21/68; G01B 11/00
(52) U.S. Cl. ............................. 33/1 M; 700/60; 700/263; 700/302
(58) Field of Search ........................ 33/1 M; 364/528.37, 364/528.34, 167.06, 468.28; 702/150, 151, 156, 33, 44; 356/400, 401; 250/548; 395/98; 700/121, 263, 302, 303, 60

(56) References Cited

U.S. PATENT DOCUMENTS

| | | | |
|---|---|---|---|
| 3,350,612 | 10/1967 | Hansen et al. | 318/143 |
| 3,781,629 | 12/1973 | Yashimoto et al. | 318/632 |
| 3,886,421 | 5/1975 | Hassan et al. | 318/593 |
| 4,016,396 | 4/1977 | Hassan et al. | 219/121.31 |
| 4,057,347 | 11/1977 | Moriyama et al. | 355/67 |
| 4,221,995 | 9/1980 | Barkman | 318/616 |
| 4,447,770 | 5/1984 | Shepherd | 318/68 |
| 4,456,860 | 6/1984 | Cann et al. | 318/561 |
| 4,535,277 | 8/1985 | Kurakake | 318/561 |
| 4,577,141 | 3/1986 | Saiki et al. | 318/590 |
| 4,634,946 | 1/1987 | Moulds, III et al. | 318/561 |
| 4,742,376 | 5/1988 | Phillips | 355/77 |
| 4,795,955 | 1/1989 | Yamashita | 318/632 |
| 4,810,941 | 3/1989 | Ohishi et al. | 388/815 |
| 4,810,946 | 3/1989 | Sweeney, Jr. | 318/561 |
| 4,818,885 | 4/1989 | Davis et al. | 250/492.2 |
| 4,952,858 | 8/1990 | Galburt | 318/647 |
| 4,972,311 | 11/1990 | Holdgrafer et al. | 364/167.01 |
| 5,070,287 | 12/1991 | Boehm | 318/569 |
| 5,153,494 | 10/1992 | Hollis, Jr. | 318/640 |
| 5,182,615 | 1/1993 | Kurosawa et al. | 356/400 |
| 5,184,055 | 2/1993 | Ohishi et al. | 318/615 |
| 5,196,745 | 3/1993 | Trumper | 310/12 |

(List continued on next page.)

Primary Examiner—Diego Gutierrez
Assistant Examiner—R Alexander Smith
(74) Attorney, Agent, or Firm—Skjerven Morrill, MacPherson LLP; Norman R. Klivans; Michael J. Halbert

(57) ABSTRACT

A positioning system used, by way of example, for lithography, uses the position of the wafer stage as the trajectory command for the reticle fine stage control circuit. The reticle fine stage position is combined with the position of the wafer stage to generate a synchronous error. The reticle fine stage control circuit uses a Jacobian differential transformation to convert the synchronous error into an positional error for the center of gravity of the reticle fine stage. Thus, any inaccuracies due to measurement errors caused by rotation of reticle fine stage are avoided. A controller filter circuit uses the positional error for the center of gravity to calculate the force on the center of gravity that will minimize the synchronous error. The controller filter circuit includes saturation limited integration behavior that minimizes the settling time. A feedforward loop also generates a feedforward force, which reduces settling time, and is combined with the force signal from the controller filter. A force coordinate transformation circuit receives the summed forces and calculates the forces to be generated by the actuators connected to reticle fine stage that will drive reticle fine stage to the desired position to reduce the synchronous error.

20 Claims, 7 Drawing Sheets

U.S. PATENT DOCUMENTS

| | | | |
|---|---|---|---|
| 5,249,118 | 9/1993 | Smith | 364/167.09 |
| 5,255,051 | 10/1993 | Allen | 355/77 |
| 5,262,707 | 11/1993 | Okazaki et al. | 318/592 |
| 5,365,672 * | 11/1994 | Kato | 33/520 |
| 5,379,108 * | 1/1995 | Nose et al. | 356/400 |
| 5,477,304 | 12/1995 | Nishi | 355/53 |
| 5,478,043 | 12/1995 | Wakui | 248/550 |
| 5,504,407 | 4/1996 | Wakui et al. | 318/568.17 |
| 5,528,118 * | 6/1996 | Lee | 318/568.17 |
| 5,537,186 | 7/1996 | Korenaga et al. | 355/53 |
| 5,545,962 | 8/1996 | Wakui | 318/677 |
| 5,548,195 | 8/1996 | Doran | 318/568.19 |
| 5,589,748 | 12/1996 | Kazama et al. | 318/560 |
| 5,614,801 * | 3/1997 | Miramonti | 318/609 |
| 5,621,497 | 4/1997 | Terasawa et al. | 355/53 |
| 5,699,145 * | 12/1997 | Makinouchi et al. | 355/53 |
| 5,757,149 * | 5/1998 | Sato et al. | 318/135 |
| 5,777,722 | 7/1998 | Miyazaki et al. | 355/53 |
| 5,793,052 * | 8/1998 | Kawaguchi | 250/559.3 |
| 5,798,822 | 8/1998 | Miyazaki et al. | 355/53 |
| 5,812,396 * | 9/1998 | Kato | 364/167.07 |
| 5,822,213 * | 10/1998 | Huynh | 364/478.01 |
| 5,874,820 * | 2/1999 | Lee | 318/575 |
| 5,877,845 | 3/1999 | Makinouchi | 355/53 |
| 5,883,702 * | 3/1999 | Tokunaga | 355/53 |
| 5,900,707 * | 5/1999 | Wakui | 318/568.17 |
| 5,907,392 * | 5/1999 | Makinouchi | 355/53 |
| 5,940,789 * | 8/1999 | Yuan | 702/150 |
| 6,144,118 * | 11/2000 | Cahill et al. | 310/12 |

* cited by examiner

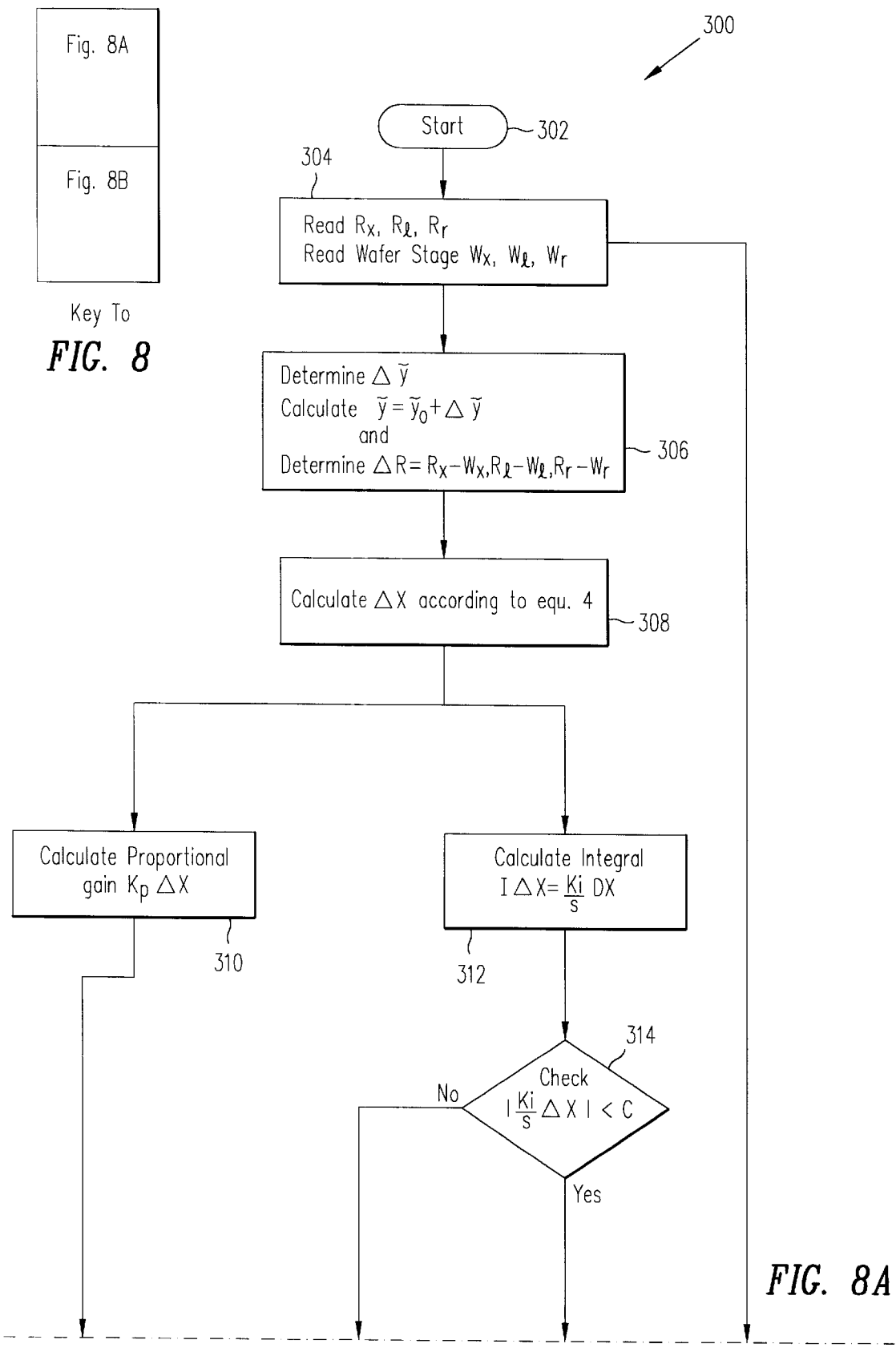

STAGE CONTROL WITH REDUCED SYNCHRONIZATION ERROR AND SETTLING TIME

FIELD OF THE INVENTION

The present invention relates to controlling a stage in a high-precision positioning instrument and in particular to controlling a fine stage with minimized synchronization error and settling time.

BACKGROUND

High-precision positioning instruments are used, for example, in machining tools, lithography equipment for semiconductor wafer processing or liquid crystal display devices, or the like. A control system drives a stage or stages of the positioning instrument in accordance with a defined path. The path may have one direction, e.g., the X coordinate direction, or two directions, e.g., the X and Y coordinate direction s.

Typically in lithography equipment for semiconductor wafer processing, a first stage is used to position the subject plate (wafer) in two dimensions, while a separate stage is used to synchronously position the mask (reticle). The stages are moved relative to a source of radiant energy and a projection lens to focus the energy as well as the base structure that supports the stages. During exposure the stages may be moved either in a constant velocity "scanning" pattern or in a "step-and-repeat" pattern.

In a high-precision positioning instrument the stages must be moved in a synchronous fashion. Where extreme precision is required, such as in a microlithographic system that produces images on the sub-micron scale, any misalignment of the stages will result in defects in the exposed image. Misalignment of the stages is known as synchronous error.

Conventional positioning instruments typically control the stages using a velocity feedback system. Thus, the controller of conventional positioning instruments emphasize velocity control over control of the position of the stage. A positioning instrument typically uses velocity information or position information obtained from a non-center of gravity location on the stage. For example an interferometer measurement system uses mirrors located on the sides of the stage. However, a measurement taken with a mirror on the side of the stage will increase or decrease, while the position of the center of gravity of the stage may not change, when the stage is rotated slightly, as illustrated in FIG. 4. Thus, a velocity error, as well as a positioning error, is possible where a stage is controlled with information derived from the non-center of gravity location. Consequently, a stage being controlled with information obtained from a non-center of gravity location may develop a synchronous error.

An additional source of synchronous error is caused by a control system that uses the absolute position of the stage as feedback, for instance by way of a linear encoder. Because the positioning system generally uses a single precision 32 bit floating point CPU, digital signal processor, or a micro-processor, the accuracy of the measurement is limited to only the 23 bits for the significant digits "significand." Thus, where the absolute position of the stage is used as feedback in a control system, the floating point unit will represent the absolute position of the stage in 23 bits. Consequently, if the absolute position of the stage is larger than 23 bits, accuracy of the position is lost.

In addition, conventional control systems typically convert the trajectory command for a stage into a force through the use of a proportional-integration differentiation (PID) device as is well known in the art. However, a conventional PID device typically permits the synchronous error to accumulate during acceleration periods. After the stage stops accelerating the synchronous error is reduced. Consequently, a period of time must elapse after the acceleration period before exposure may begin because the synchronous error must be eliminated. This time is known as the settling time of the system and is a limitation on the throughput of the system.

Thus, a position control system that drives the center of gravity of the stage with a level of accuracy that is not affected by the absolute position of the stage is needed to reduce synchronous error. Moreover, a position control system that limits the accumulation of synchronous error thereby reducing settling time is needed.

SUMMARY

A positioning instrument, which may be used in a lithography machine for example, includes a wafer stage, a reticle coarse stage, and reticle fine stage connected to the reticle coarse stage. A position measurement system, such as an interferometer measurement system, provides the position of the wafer stage that is used to generate a fine stage trajectory command signal. A second position measurement system, which may be an interferometer measurement system, measures the position of the reticle fine stage. The position of the reticle fine stage is combined with the fine stage trajectory command and the difference is the synchronous error of the reticle fine stage.

A fine stage control circuit receives the synchronous error and uses a Jacobian differential coordinate transformation to convert the synchronous error into a positional error with respect to the center of gravity of the reticle fine stage. Thus, the effects of measuring errors caused by the rotation of the reticle fine stage may be minimized.

A controller filter uses the positional error to calculate the forces on the center of gravity of the reticle fine stage that will minimize the positional error. The controller filter uses a saturation-limited integrator that limits the integration of the positional error to a desired constant value. Consequently, the synchronous error produced during acceleration is limited, thus reducing the settling time of the system. A feedforward force is combined with the output of the controller filter to further reduce the settling time.

The combined force signals are received by a force coordinate transformation circuit that calculates the forces to be generated by actuators connected to reticle fine stage and produces a command signal that controls actuators, which drive reticle fine stage to the desired position to reduce the synchronous error.

In addition, the synchronous error may be further reduced by using a single precision floating point digital signal processor, micro-processor, or the like, where the positions of the wafer stage and reticle fine stage as well as the synchronous error are represented as integers.

BRIEF DESCRIPTION OF THE DRAWINGS

FIGS. 8, 8A and 8B are a flowchart indicating the processing performed by the differential coordinate transformation circuit, the controller filter circuit, the force coordinate transformation circuit and the feedforward loop.

DETAILED DESCRIPTION

Figure 1:
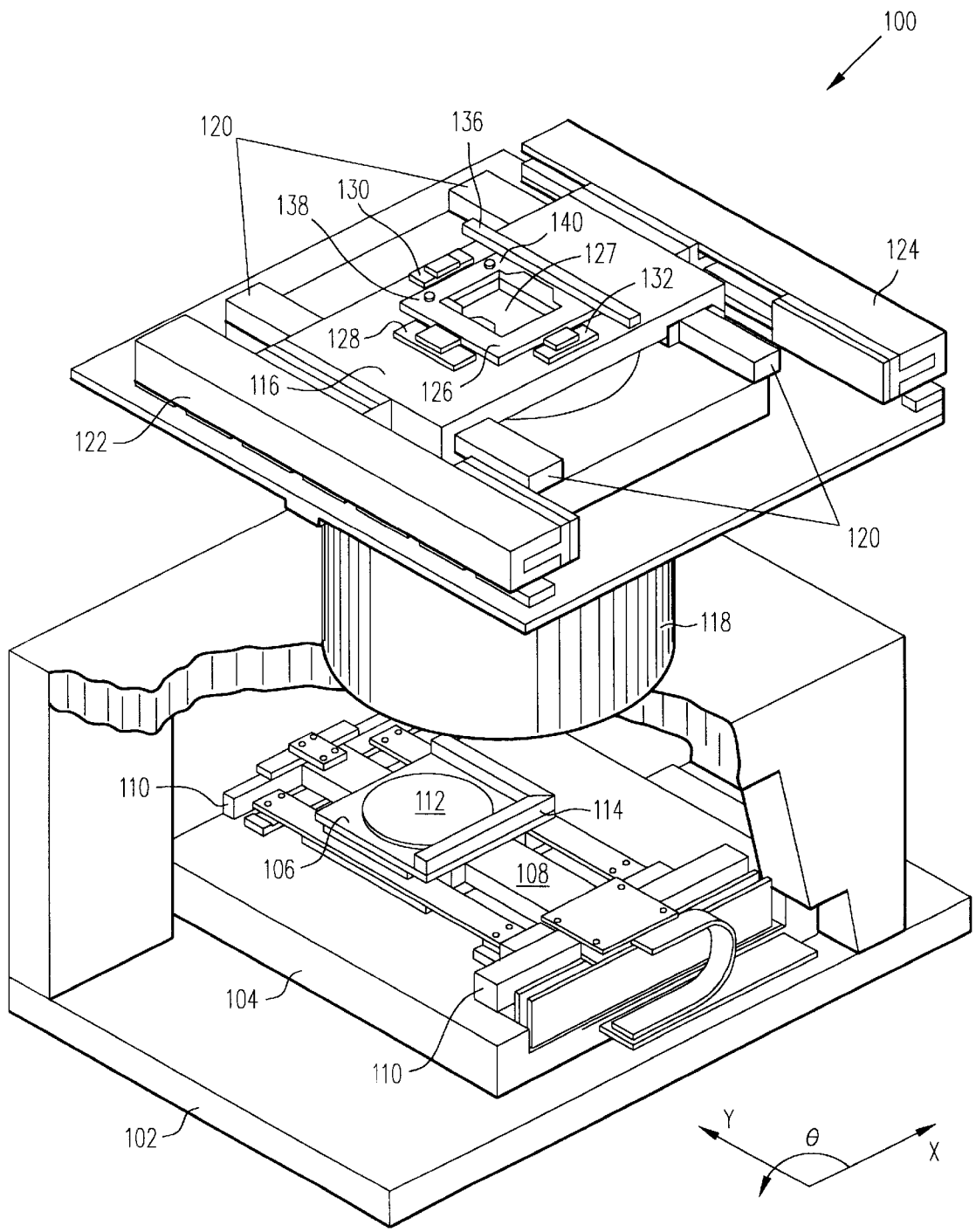
FIG. 1 is a perspective view of a positioning instrument in accordance with one embodiment of the present invention.

FIG. 1 is a perspective view of a positioning instrument 100 with a fine stage 126 that synchronously moves with wafer stage 106. Positioning instrument 100 is shown as a lithography apparatus for semiconductor wafer processing. It will be understood, however, that positioning instrument 100 may be used for any purposes where high precision positioning is desirable, such as for liquid crystal display device processing, and is only an exemplary illustration of the invention.

Positioning instrument 100, as shown in FIG. 1, is supported by a conventional anti-vibration structure (not shown) and includes a body 102 with a base 104 attached thereto. A wafer (plate) stage 106 rides on a center beam 108 that is movably connected to base 104 via two side beams 110. Center beam 108 acts as a guide for the movement of wafer stage 106 in the Y coordinate direction as illustrated (the arrows are intended only to illustrate the coordinate directions and are not part of positioning instrument 100).

Center beam 108 rides on two side beams 110, which act as guides for movement of center beam 108 in the X coordinate direction. Wafer stage 106 scans in the Y coordinate direction at a constant velocity, for example 1 cm/sec, and steps a desired distance in the X coordinate at the beginning or end of each scan. Wafer stage 106 is shown conventionally holding a wafer 112 and mounted on stage 106 are two mirrors 114, 115 used as points of measurement to measure the position of wafer stage 106, for example with a conventional interferometer measurement apparatus (not shown).

A reticle (mask) coarse stage 116 is shown positioned above wafer stage 106, with a conventional projection lens 118 disposed between reticle coarse stage 116 and wafer stage 106. Reticle coarse stage 116 includes linear motor guides 120 that are used with two actuators 122, 124 to drive reticle coarse stage 116 at a constant velocity in the Y coordinate direction. Actuators 122 and 124 may be linear motors, voice coil motors or electromechanical stepping motors.

A reticle fine stage 126 is positioned on reticle coarse stage 116 and carries a reticle (mask) 127 in a conventional manner. Reticle fine stage 126 is vertically supported on reticle coarse stage 116 by anti-friction bearings (not shown), such as air bearings or roller bearings, as is well known in the art. Four actuators 128, 130, 132, and 134 (actuator 134 is not visible in FIG. 1), such as voice coil motors, are used to move reticle fine stage 126 in the X and Y coordinate directions to a desired position.

A planar mirror 136 is attached to reticle fine stage 126 and is used by an interferometer measurement system (not shown) to provide a point of measurement for reticle fine stage 126 in the X coordinate direction. A conventional interferometer measurement system may be used with planar mirror 136. In addition, two corner cubed mirrors 138, 140 are mounted on reticle fine stage 126 for use with an interferometer measurement system (not shown). Corner cubed mirrors 138 and 140 provide two points of measurement on the respective left side and right side of reticle fine stage 126 in the Y coordinate direction. Corner cubed mirrors 138 and 140 are used together to measure the rotation of reticle fine stage 126 in the E) (angular rotation) coordinate direction.

To produce an acceptable exposure image, reticle fine stage 126 moves with wafer stage 106 within a desired synchronization range, while an exposure device (not shown) such as a light source, illuminates wafer 112 through reticle 127 and projection lens 118. Wafer stage 106 and reticle coarse stage 116 move at constant velocities in the Y coordinate direction while reticle fine stage 126 is precisely positioned on reticle coarse stage 116 to correct for any small deviations from synchronicity with wafer stage 106. Although both wafer stage 106 and reticle coarse stage 116 move at constant velocities in the Y coordinate direction, the velocities of wafer stage 106 and reticle coarse stage 116 need not be the same. It may be desirable for the velocities of wafer stage 106 and reticle coarse stage 116 to differ by some proportion to produce a proportionally reduced exposed image on wafer 112.

Figure 2:
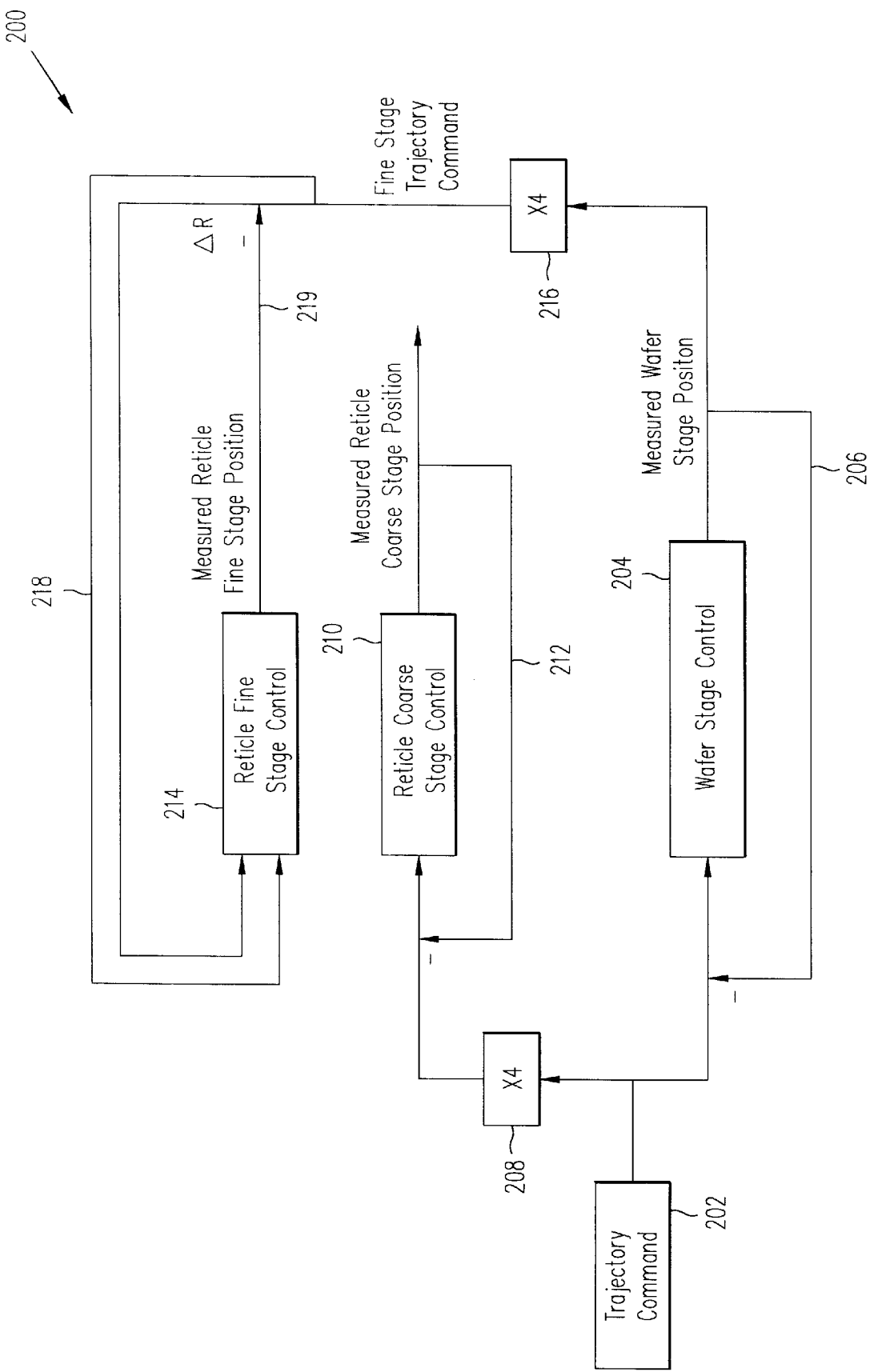
FIG. 2 is a block diagram of a control system that minimizes synchronous error and settling time.

A block diagram of a control system 200 for positioning instrument 100 used to maintain . synchronicity between wafer stage 106 and reticle fine stage 126 is shown in FIG. 2. Control system 200 includes a trajectory command circuit 202, which outputs a command trajectory signal for the desired positions of wafer stage 106 and reticle fine stage 126. Trajectory command circuit 202 may be a digital signal processor, micro-processor, or micro-controller programmed with the desired trajectory of wafer stage 106. The command trajectory signals are typically digital signals.

The command trajectory signals are fed directly to wafer stage control circuit 204. A conventional wafer stage control circuit, such as a digital signal processor, micro-processor, or micro-controller as are well known in the art, may be used for wafer stage control circuit 204. A wafer stage position signal representing the measured position of wafer stage 106 is fed back and combined with the command trajectory signal via position feedback loop 206. The position of wafer stage 106 is determined in the X and Y coordinate directions via an interferometer measurement system using mirrors 114, 115 as shown in FIG. 1. The interferometer measurement system measures the position of wafer stage 106 relative to a stationary object, such as projection lens 118. Although the present discussion is related to an interferometer measurement system, it should be understood that other type of measurement systems, such as a linear encoder, may be used.

The trajectory command signal from trajectory command block 202 is also fed to reticle coarse stage control circuit 210. However, the trajectory command signal is first multiplied by a desired reduction ratio via multiplier circuit 208, thereby producing a coarse stage trajectory command signal. It should be understood that multiplier circuit 208 is part of trajectory command circuit 202 and thus the multiplication of the trajectory command signal by the desired reduction ratio may be accomplished by the software of the trajectory command circuit 202. Multiplier circuit 208 is shown as a separate circuit as an illustration of functionality. Of course, multiplier circuit 208 may also be a separate device such as a digital signal processor, micro-processor, or microcontroller as are well known in the art. As shown in FIG. 2, a multiple of 4 is used for the reduction ratio by multiplier block 208, however, any reduction ratio may be used and is typically governed by projection lens 118. However, any reduction ratio may be provided by multiplier block 208.

The position of reticle coarse stage 116 is determined by an interferometer measurement system or other appropriate position measurement device, such as a linear encoder. The position signal representing the measured position of reticle coarse stage 116 is combined via feedback loop 212 with the coarse stage trajectory command signal and received by reticle coarse stage control circuit 210. Reticle coarse stage control circuit 210 may be a conventional control unit, of the type well known by those of ordinary skill in the art.

The wafer stage position signal is provided to a reticle fine stage control circuit 214 via multiplier circuit 216. Multiplier circuit 216 is similar to multiplier circuit 208 and multiplies the wafer stage position signal by the same reduction ratio as used in multiplier circuit 208, thereby producing a fine stage trajectory command signal. Multiplier circuit 216 is implemented within wafer stage control system 204, however, it may also be implemented within reticle fine stage control circuit 204.

The fine stage trajectory command signal is combined With a measured reticle fine stage position via position feedback loop 219. The position of reticle fine stage 126, shown in FIG. 1, is determined by an interferometer measurement system using planar mirror 136 and corner cubed mirrors 138 and 140. The position of reticle fine stage 126 is measured by interferometer measurement system relative to the same stationary object used to measure the position of wafer stage 106, e.g., projection lens 118.

Thus, the measured fine stage position signal is combined with the fine stage trajectory command signal thereby producing a synchronous error signal. The synchronous error signal reflects the difference between the fine stage position signal and the fine stage trajectory command signal, which is the synchronous error AR between reticle fine stage 126 and the "proportional" position of wafer stage 106, i.e., the position of wafer stage 106 factoring in the reduction ratio.

Control system 200 uses the position of wafer stage 106 to generate the fine stage trajectory command signal. The fine stage trajectory command signal provides the desired position of reticle fine stage 126, as opposed to a desired velocity or acceleration, where the desired position is derived directly from the actual position of wafer stage 106. Consequently, reticle fine stage 126 maintains a high degree of synchronicity with wafer stage 106. Further, no velocity or acceleration feedback is necessary.

In addition, a feedforward loop 218, discussed in more detail below, directly provides the fine stage trajectory command signal to reticle fine stage control circuit 214. Feedforward loop 218 is used to reduce the settling time of reticle fine stage 126.

Figure 3:
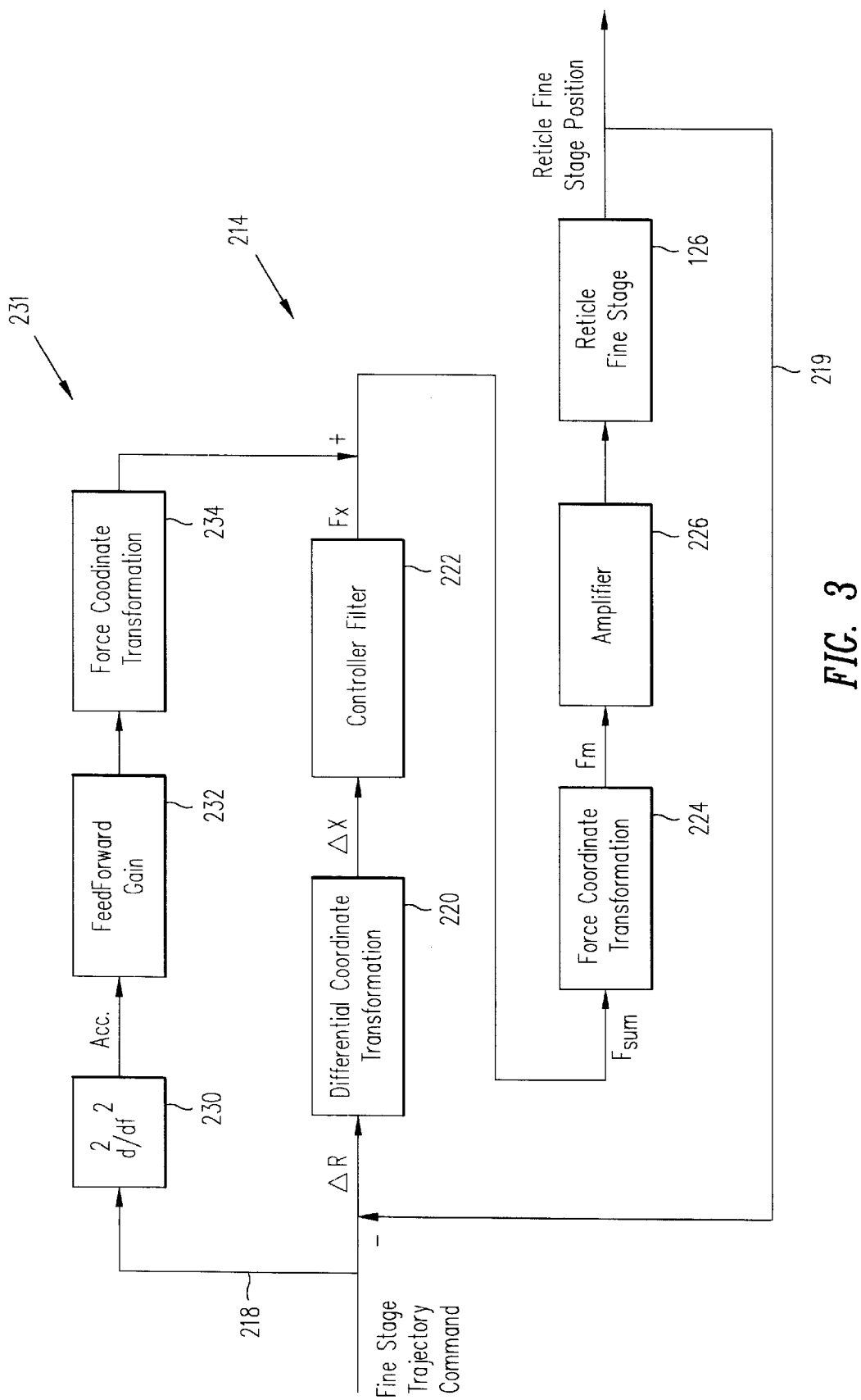
FIG. 3 is a block diagram of a reticle fine stage control system that minimizes synchronous error and settling time.

FIG. 3 shows a block diagram of reticle fine stage control circuit 214. Reticle fine stage control circuit 214 receives the fine stage trajectory command signal which is combined with the measured reticle fine stage position signal via position feedback loop 219. Thus, a synchronous error signal reflecting the synchronous error ΔR is generated.

Figure 4:
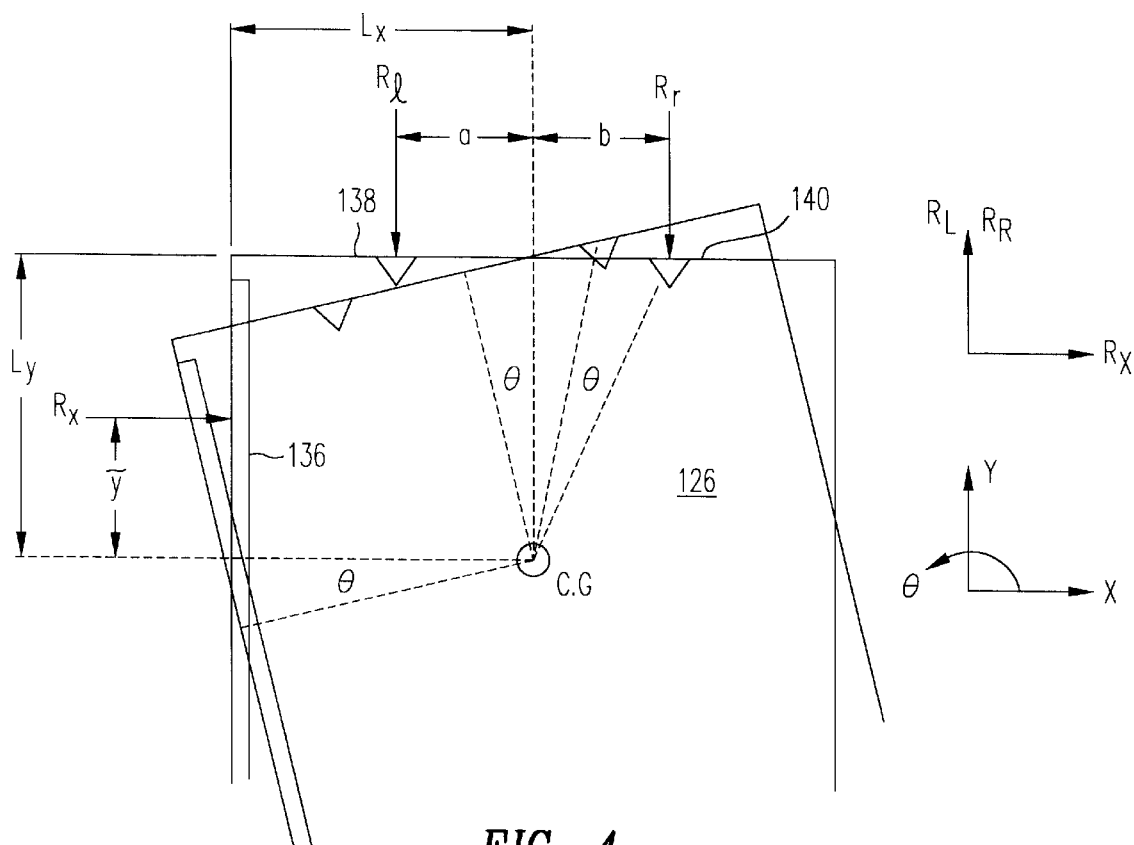
FIG. 4 is a top view of a reticle fine stage showing the relationship between the center of gravity of the reticle fine stage and the position measurement points.

The synchronous error ΔR of reticle fine stage 126 is comprised of several synchronous error terms including $\Delta R_X$ representing the synchronous error in the X coordinate direction of reticle fine stage 126 as measured from the measuring point on planar mirror 136, $\Delta R_r$ representing the synchronous error in the Y coordinate direction of the right side of reticle fine stage 126 as measured from mirror 140, and $\Delta R_l$ representing the synchronous error in the Y coordinate direction of the left side of reticle fine stage 126 as measured from mirror 138, as shown in FIGS. 1 and 4 (discussed below).

Interferometer measuring systems are advantageously used to determine the respective positions of reticle fine stage 126 and wafer stage 106, because interferometer measuring systems are differential measurement systems. In other words, the measured (actual) positions of reticle fine stage 126 and wafer stage 106 are measured in terms of how much the positions have changed.

The synchronous error signal reflecting the synchronous error ΔR between the proportional position of wafer stage 106 and reticle fine stage 126 is digital and is represented as an integer. The use of integers is advantageous because the accuracy level is increased with the use of a single precision floating point calculation unit in fine stage control circuit 214. For example, in a 32 bit floating point unit, 23 bits are typically used as the significand, or significant digits. Where a small differential position which is represented as an integer is used, the 23 bits can accurately represent the position. If the absolute position of the stage is used instead, accuracy is lost because the absolute position may be a large value and hence the 23 bits are inadequate.

The synchronous error signal representing the synchronous error ΔR is received by a differential coordinate transformation circuit 220, which generates positional error signal reflecting the positional error ΔX of the center of gravity of the reticle fine stage 126. Differential coordinate transformation circuit 220 is a digital signal processor or microprocessor programmed with a Jacobian coordinate transformation, which is a known coordinate transformation. The positional error ΔX is comprised of positional errors terms Δx, Δy, and ΔΘ in the X, Y, and Θ coordinate directions, respectively.

FIG. 4 shows diagramatically the geometric relationship between the center of gravity C.G. of reticle fine stage 126 and the points used to measure the position of reticle fine stage 126. As shown in FIG. 4, a position measurement $R_X$ measures the position of reticle fine stage 126 in the X coordinate direction at a point on planar mirror 136, while a position measurement $R_l$ measures the position of the left side of reticle fine stage 126 in the Y coordinate direction at a point via corner cubed mirror 138, and a position measurement $R_r$ measures the position of the right side of reticle fine stage 126 in the Y coordinate direction at a point via corner cubed mirror 140.

Where reticle fine stage 126 is orthogonal to the X and Y coordinate system as illustrated in FIG. 4, the measuring points on corner cubed mirrors 138 and 140 for position measurements $R_l$ and $R_r$ are distances a and b, respectively, from a center line from the center of gravity C.G. of reticle fine stage 126 in the Y coordinate direction. Moreover, the measuring point on planar mirror 136 for position measurement $R_x$ is a distance ȳ from a center line from the center of gravity C.G. of reticle fine stage 126 in the X coordinate direction. Because the measuring point for position measurement $R_X$ is a point along planar mirror 136, as reticle fine stage scans in the Y direction, the distance y will change. The center of gravity C.G. is a distance Lx from the left side and a distance $L_Y$ from the lead side of reticle fine stage 126.

As can be seen in FIG. 4, if reticle fine stage 126 rotates in the Θ direction, the position measurements $R_X$, $R_r$ and $R_l$ will change despite the position of the center of gravity C.G. remaining the same. Thus, if reticle fine stage 126 rotates in the Θ direction, it will appear from position measurement $R_x$ that reticle fine stage 126 moved in the −X coordinate direction. Further, from position measurement $R_r$ it will appear that the right side of reticle fine stage 126 moved in the Y coordinate direction, while from position measurement $R_l$ it will appear that the left side of reticle fine stage 126 moved in the −Y coordinate direction. Consequently, for an accurate measurement of the synchronous error ΔR, the coordinates are transformed to the center of gravity C.G.

The reticle fine stage position measurement $R_x$, is combined with the position measurement of wafer stage 106 in the X coordinate direction to generate the synchronous error $ΔR_x$. Likewise, reticle fine stage position measurements $R_r$, and $R_l$ are combined with the position measurement of wafer stage 106 in the Y coordinate direction to generate synchronous errors $ΔR_r$ and $ΔR_l$. In an alternative embodiment, the position measurements $R_r$ may be combined with a right side position measurement of wafer stage 106, while position measurement $R_l$ is combined with a left side position measurement of wafer stage 106 to generate synchronous errors $ΔR_r$ and $ΔR_l$. The distance $\tilde{y}$ is determined by adding the distance reticle fine stage 126 travels in the Y coordinate direction with the known position of the center of gravity C.G. The precise position of the center of gravity C.G. of reticle fine stage 126 is known because the reticle fine stage 126 starts its movement from a known position in positioning instrument 100. By measuring the incremental changes in the position measurements $R_l$ and $R_r$, the distance the center of gravity C.G. of reticle fine stage 126 travels in the Y coordinate direction may be determined. Consequently, incremental changes $Δ\tilde{y}$ of the distance $\tilde{y}$ can be determined and summed with the last known distance $\tilde{y}_0$. Thus, the distance $\tilde{y}$ between the center line from the center of gravity C.G. of reticle fine stage 126 and the measuring point for position measurement $R_x$ is known.

The positional errors Δx, Δy, and ΔΘ of the center of gravity C.G. and distance $\tilde{y}$ may be related to the synchronous errors $ΔR_x$, $ΔR_l$, and $ΔR_r$ by the following:

$$ΔR_x = Δx = \tilde{y}ΔΘ - L_x \frac{(ΔΘ)^2}{2}$$ equ. 1

$$ΔR_l = Δy - aΔΘ$$

$$ΔR_r = Δy + bΔΘ$$

where $L_x$ is the distance of the center of gravity C.G. from the left side of reticle fine stage 126, $\tilde{y}$ is the distance between the measuring point for position measurement $R_x$ and a center line from the center of gravity C.G. of reticle fine stage 126 in the X coordinate direction, a and b are the respective distances between the measuring points for position measurements $R_l$ and $R_r$, respectively, and a center line from the center of gravity C.G. of reticle fine stage 126 in the Y coordinate direction.

Because any rotation in the Θ direction of reticle fine stage 126 will be small, the term $(ΔΘ)^2$ will be very small and may be ignored. Therefore, the equ. 1 above may be approximated as:

$$\begin{bmatrix} ΔR_x \\ ΔR_l \\ ΔR_r \end{bmatrix} = \begin{bmatrix} 1 & 0 & -\tilde{y} \\ 0 & 1 & -a \\ 0 & 1 & b \end{bmatrix} \begin{bmatrix} Δx \\ Δy \\ ΔΘ \end{bmatrix}$$ equ. 2

Where the terms $ΔR_x$, $ΔR_l$, and $ΔR_r$ comprise the synchronous error ΔR and the terms Δx, Δy, and ΔΘ comprise the term ΔX, equ. 2 may be expressed as:

$$ΔR = JΔX$$ equ. 3 where J is a Jacobian relationship.

As shown in FIG. 3, differential coordinate transformation circuit 220 receives synchronous error ΔR and produces the positional error ΔX for the center. of gravity C.G. Thus, differential coordinate transformation circuit 220 is programmed to solve for ΔX according to the following:

$$ΔX = J^{-1}ΔR$$ equ. 3 or:

$$\begin{bmatrix} Δx \\ Δy \\ ΔΘ \end{bmatrix} = \begin{bmatrix} 1 & -\frac{\tilde{y}}{l} & \frac{\tilde{y}}{l} \\ 0 & \frac{b}{l} & \frac{a}{l} \\ 0 & -\frac{1}{l} & \frac{1}{l} \end{bmatrix} \begin{bmatrix} ΔR_x \\ ΔR_l \\ ΔR_r \end{bmatrix}$$ equ. 4 where l=a+b.

Thus, differential coordinate transformation circuit 220 shown in FIG. 3 is programmed to determine the positional error ΔX of the center of gravity C.G. of reticle fine stage 126 and generate a corresponding positional error signal using the Jacobian transformation shown in equ. 4. The coding of software to implement the Jacobian coordinate transformation of equ. 4 in differential coordinate transformation circuit 220 is well within the knowledge of those of ordinary skill in the art in light of the present disclosure.

The position error signal generated by differential coordinate transformation circuit 220 is received by a controller filter circuit 222. Controller filter circuit 222 provides a proportional gain (Kp) plus a saturation-limited integral action (I), followed by a lead filter. Mathematically controller filter block 222 provides a filtered position of the center of gravity C.G. as follows:

$$Fx = (Kp + I)\left(\frac{s+a}{s+b}\right)ΔX$$ equ. 5 where Fx is the force on the center of gravity C.G. required to minimize the positional error Δx, Kp is a proportional gain term, I is a saturation-limited integral term, s+a/s+b is a lead filter term using a Laplace transform, and ΔX is the positional error of the center of gravity C.G. Where the position signals for wafer stage 106 and reticle fine stage 126 are integers, the positional error signals will be integers. Thus, controller filter circuit 222 uses discrete proportional gain, integration and lead filter functions.

Figure 5:
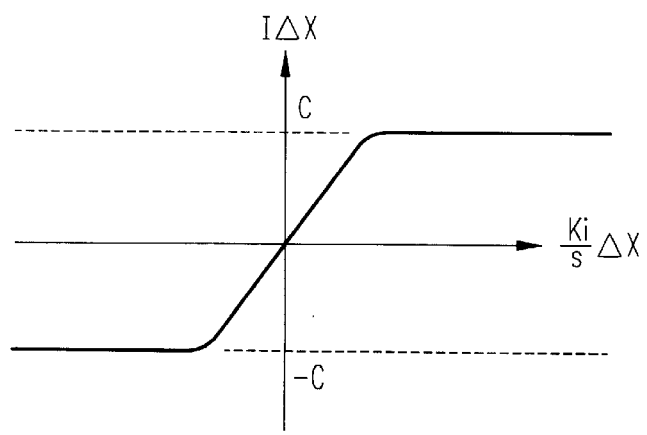
FIG. 5 is a plot showing the integral term $I\Delta X$ along the Y axis and the term $(Ki/s)\Delta X$ on the X axis.

Controller filter circuit 222 uses a saturation limited integral term I, which reduces settling time of the system. FIG. 5 shows a plot of the integral term IΔX along the Y axis and the term (Ki/s)ΔX on the X axis, where Ki is the integral with respect to time, and s is the Laplace transform. The constant C is an empirical value chosen to limit saturation of the integral term. The saturation limited integral functions as shown below.

$$I\Delta X = \begin{cases} \frac{Ki}{s}\Delta X, \text{ when } \left|\frac{Ki}{s}\Delta X\right| < C \\ C, \text{ when } \frac{Ki}{s}\Delta X \geq C \\ -C, \text{ when } \frac{Ki}{s}\Delta X \leq -C \end{cases} \quad \text{equ. 6}$$

Thus, the integral $I\Delta X$ is limited to $\pm C$ and values in between.

Figure 6A:
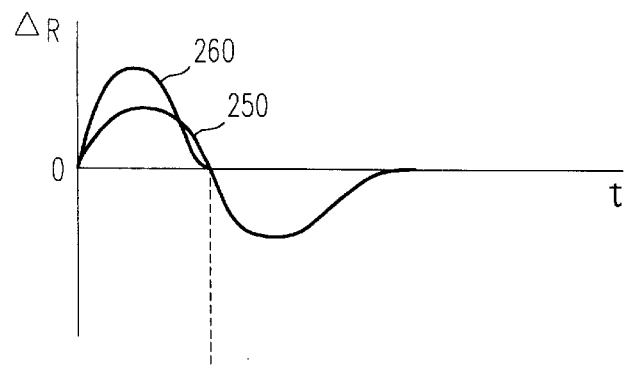
FIG. 6A is a plot of the synchronous error $\Delta R$ of the reticle fine stage with respect to time.
Figure 6B:
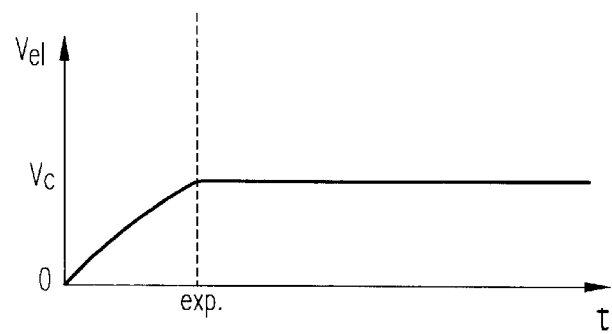
FIG. 6B is a plot of the velocity trajectory curve of the reticle fine stage with respect to time.

FIG. 6A shows a plot of the synchronous error $\Delta R$ along the Y axis and time along the X axis. FIG. 6B shows the velocity curve of reticle fine stage 126, where the Y axis represents velocity and the X axis represents time. As shown in FIG. 6B, reticle fine stage 126 accelerates from time $t_0$ until a time $t_{exp}$ at which time reticle fine stage 126 has a constant velocity Vc and the exposure of wafer 112 (shown in FIG. 1) begins.

Curve 250 in FIG. 6A represents the synchronous error $\Delta R$ where a conventional integration component is used in controller filter circuit 222. As shown in FIG. 6A, curve 250 remains positively saturated until time $t_{exp}$ at which time the synchronous error $\Delta R$ curve 250 overshoots zero and becomes negative. Thus, a settling period is required by curve 250 during which the synchronous error $\Delta R$ is allowed to approach zero after acceleration of reticle fine stage 126 has stopped.

However, where the integration component has a saturation limit as described in equ. 6, a synchronous M error $\Delta R$ as represented by curve 260 is generated. Although curve 260 has a higher amplitude than curve 250, the synchronous error $\Delta R$ represented by curve 260 decreases quickly. Thus, at time $t_{exp}$ curve 260 has a value of approximately zero. Consequently, curve 260 has a fast settling time. The settling time of curve 260 may be varied by adjusting the constant C in equ. 6.

Controller filter circuit 222 is thus programmed to generate a force signal reflecting the force Fx on the center of gravity C.G. of reticle fine stage 126 that will minimize the positioning error $\Delta X$ as per equations 5 and 6. The coding of software to implement a conventional proportional gain (Kp), a saturation-limited integral action (I) according to equ. 6, and a lead filter function in controller filter circuit 222 is well within the knowledge of those of ordinary skill in the art in light of the present disclosure.

As shown in FIG. 3, the force signal Fx from controller filter circuit 222 is combined with a feedforward force signal and the sum Fsum is received by a force coordinate transformation circuit 224. Force coordinate transformation circuit 224 converts the summed force signal from controller filter 222 and feedforward force signal to a command signal that reflects the force Fm that is to be generated by actuators 128, 130, 132, and 134, shown in FIG. 1 and 7 below, to drive the center of gravity C.G. of reticle fine stage 126 to the desired position. The command signal generated by force coordinate transformation circuit 224 is used to control amplifier 226, which drives actuators 128, 130, 132, and 134. Force coordinate transformation block circuit 224 may be a conventional digital signal processor, micro-processor or the like.

Figure 7:
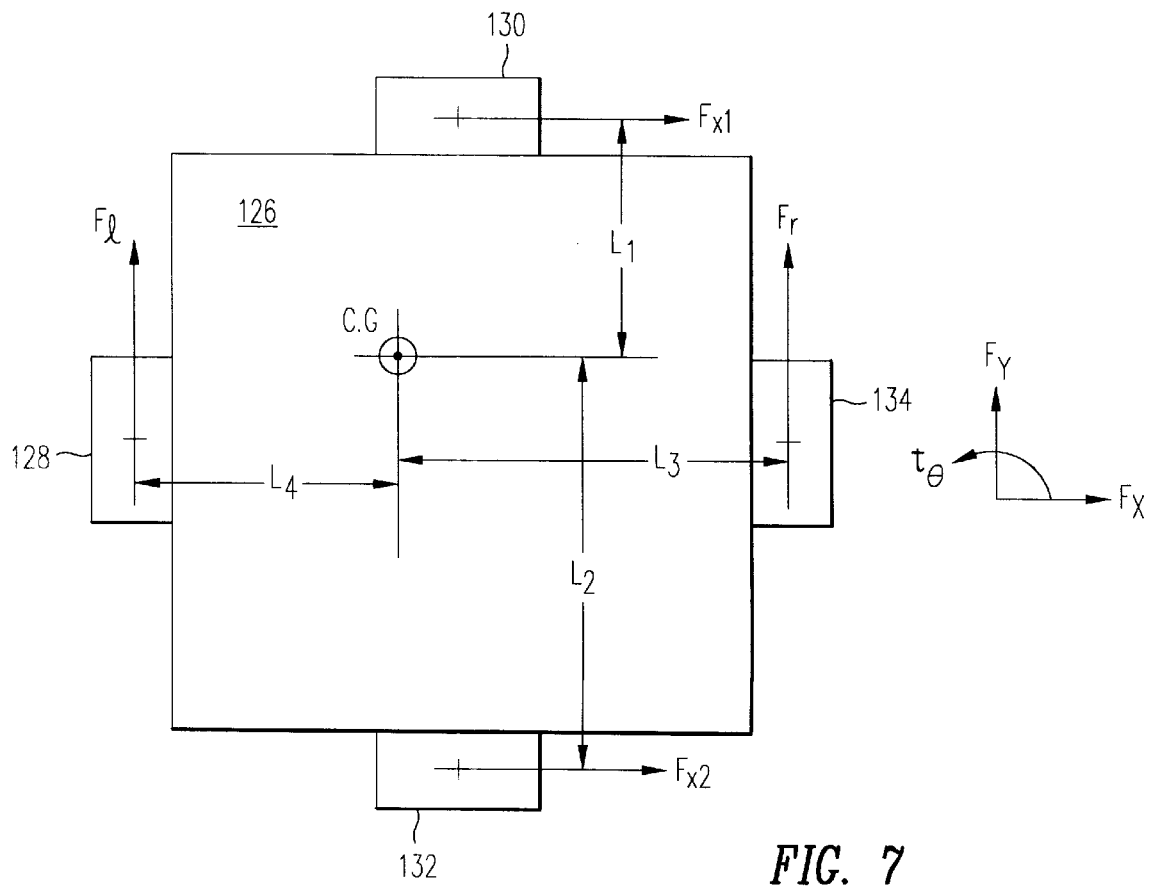
FIG. 7 is a top view of the reticle fine stage showing the relationship of the forces provided by the actuators on the center of gravity.

FIG. 7 shows a simplified top (plan) view of reticle fine stage 126 with the forces provided by actuators 128, 130, 132, and 134. As shown in FIG. 7, actuators 128, 130, 132, and 134, which may be voice coil motors, provide respective forces $F_l$, $F_{x1}$, $F_{x2}$, and $F_r$ on the center of gravity C.G. of reticle fine stage 126. It should be understood that actuators 128, 130, 132, and 134 may also provide the opposite of these forces, i.e., $-F_l$, $-F_{x1}$, $-F_{x2}$, and $-F_r$.

Actuators 130 and 132 each provide a respective force $F_{x1}$ and $F_{x2}$, which in conjunction provide a net force $F_X$ on the center of gravity C.G. of reticle fine stage 126, as the force coordinate system in FIG. 7 illustrates. Likewise, actuators 128 and 134 each provide forces $F_l$ and $F_r$ which in conjunction generate a net force $F_Y$ on the center of gravity C.G. in the Y coordinate direction. Actuators 128 through 134 may also provide a net torque $T_\Theta$ on reticle fine stage 126 to provide accelerate reticle fine stage 126 in the $\Theta$ direction.

As shown in FIG. 7, the center of gravity C.G. of reticle fine stage 126 is not necessarily in the center of reticle fine stage 126. The center of gravity C.G. has a distance $l_1$ from the force applied by actuator 130, a distance $l_2$ from the force applied by actuator 132, a distance $l_3$ from the force applied by actuator 134, and a distance $l_4$ from the force applied by actuator 128. By way of an example, the distances between the center of gravity C.G. and forces applied by the individual actuators are: $l_1$=0.1488 m, $l_2$=0.1532 m, $l_3$=0.1717 m, and $l_4$=0.1463.

The net forces on the center of gravity C.G. of reticle fine stage 126 may be expressed as follows:

$$M\frac{d^2X}{dt^2} = F_x \quad \text{equ. 7}$$

$$M\frac{d^2Y}{dt^2} = F_Y$$

$$I\frac{d^2\Theta}{dt^2} = T_\Theta$$

where M is the mass of reticle fine stage 126, approximately 4 kg, and I is the moment of inertia of reticle fine stage 126, approximately $6.68E^{-2}$ kg/m$^2$, and the term $d^2/dt^2$ is the second derivative with respect to time.

The forces to be produced by actuators 128, 130, 132, and 134 may generate net forces $F_X$, $F_Y$, and $T_\Theta$ on the center of gravity C.G. of reticle fine stage 126 according to the following:

$$\begin{bmatrix} F_X \\ F_Y \\ T_\Theta \end{bmatrix} = \begin{bmatrix} 1 & 1 & 0 & 0 \\ 0 & 0 & 1 & 1 \\ -l_1 & l_2 & -l_4 & l_3 \end{bmatrix} \begin{bmatrix} F_{x1} \\ F_{x2} \\ F_l \\ F_r \end{bmatrix} \quad \text{equ. 8}$$

The forces $F_{x1}$ and $F_{x2}$ generated by actuators 130 and 132 may each produce half of the net force $F_X$, which may be expressed as:

$$F_{x1} = 0.5 F_X \quad \text{equ. 9}$$

$$F_{x2} = 0.5 F_X \quad \text{equ. 10}$$

The forces $F_l$ and $F_r$ needed to generate the desired net forces $F_Y$ and $T_\Theta$ may then be found by inverting equ. 8 as follows:

$$\begin{bmatrix} F_l \\ F_r \end{bmatrix} = \frac{1}{l_3 + l_4} \begin{bmatrix} l_3 & -1 \\ l_4 & 1 \end{bmatrix} \begin{bmatrix} F_Y \\ T_\Theta - 0.5 F_X(l_2 - l_1) \end{bmatrix} \quad \text{equ. 11}$$

Thus, force coordinate transformation circuit 224 is programmed with equations 9, 10, and 11 to generate the command signal with the forces to be generated by each actuator to move reticle fine stage 126 to the desired position. The coding of software to implement equations 9, 10, and 11 within force coordinate transformation circuit 224 is well within the knowledge of those of ordinary skill in the art in light of the present disclosure.

The command signal produced by force coordinate transformation circuit 224 controls amplifier 226 as shown in FIG. 3. Amplifier 226 is a conventional current mode amplifier. A current mode amplifier is used because if voice coil motors or linear motors are used as actuators 128, 130, 132, and 134 the output force is constantly proportional to the input current. Amplifier 226, thus, generates current signals that drive actuators 128 through 134, which in response move reticle fine stage 126 to the desired position.

Reticle fine stage control circuit 204 also includes a feedforward loop 231, including a differentiation circuit 230, a feedforward gain circuit 232, and a force coordinate transformation circuit 234. Feedforward loop 231 is a digital signal processor, micro-processor or the like. Feedforward loop 231 receives fine stage trajectory command signal via line 218. The fine stage trajectory command signal is differentiated twice with respect to time by a conventional differentiation circuit 230. Thus, differentiation circuit 230 generates an acceleration signal. The coding of software to generate an acceleration signal with differentiation circuit 230 is well within the knowledge of those of ordinary skill in the art.

The acceleration signal is received by a feedforward gain circuit 232, which generates a gain in the acceleration signal. Feedforward gain circuit 232 thus generates a feedforward signal representing the desired feedforward acceleration of reticle fine stage 126. Feedforward gain circuit 232 generates a variable gain in the acceleration signal depending on whether wafer stage 106, shown in FIG. 1, is accelerating, decelerating, or depending on the weight of the reticle fine stage 126. Feedforward gain circuit 232 may also produce a constant gain if desired.

The feedforward signal from feedforward gain circuit 232 is received by a force coordinate transformation circuit 234. Force coordinate transformation circuit 234 may be a digital signal processor, micro-processor or the like. Force coordinate transformation circuit 234 used in the feedforward loop 231 produces a feedforward force signal reflecting the desired feedforward force on the center of gravity C.G. of reticle fine stage 126. by transforming the force signal generated by differential circuit 230 and feedforward gain circuit 232 into the center of gravity C.G. reference frame using the Jacobian transformation of equ. 4. The feedforward force signal from the force coordinate transformation block 234 is then summed with the force Fx on the center of gravity C.G. of reticle fine stage 126 produced by controller filter circuit 222 generating a summed force signal Fsum, which is then provided to force coordinate transformation circuit 224 as described above.

Figure 8B:
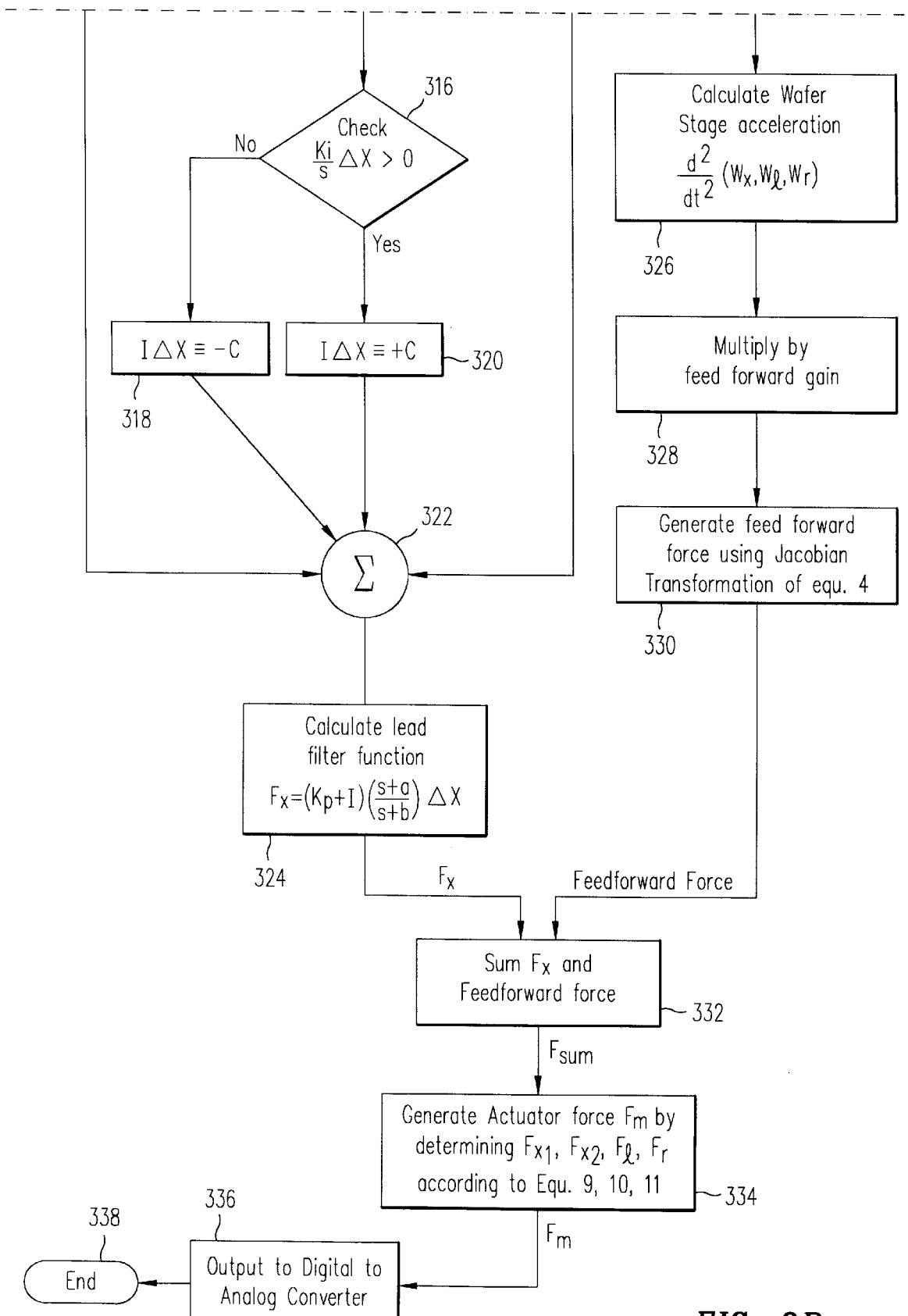

As those of ordinary skill in the art will understand, most of reticle fine stage control circuit 204, including differential coordinate transformation circuit 220, controller filter 222, force coordinate transformation circuit 224, differentiation circuit 230, feedforward gain circuit 232, and force coordinate transformation circuit 234 may be part of the same digital signal processor, or micro-processor running off the same software code. FIGS. 8, 8A and 8B are a self explanatory flowchart 300 depicting the processing of reticle fine stage control circuit 204. As shown in flowchart 300, processing begins and the coordinate transformation described in reference to differential coordinate transformation circuit 220 occurs in steps 302 to 308. The processing of controller filter circuit 222 is described in flowchart 300 in steps 310 to 324. The processing of feedforward loop 231 is described in steps 326 to 330. Finally, the summing of force Fx and feedforward force as well as the processing of force coordinate transformation circuit 224 is shown in steps 332 and 334. The coding of software to implement the above functions is well within the skill of those in the art in light of the present disclosure.

Although the present invention has been described in considerable detail with reference to certain versions thereof, other versions are possible. For example, reticle fine stage 126 may be controlled with a greater or lesser number of actuators. One having ordinary skill in the art will be able to adapt force coordinate transformation circuit 224 for the use of a different number of actuators. Additionally, force coordinate transformation circuit 224 may use alternative methods of deriving the forces to be generated by each actuator. Positioning system 100 is not restricted to the system shown in FIG. 1. Positioning system 100 may have a fine stage on the wafer stage 106, or positioning instrument 100 may use a reticle fine stage that is not coupled to a coarse stage. Further, the manner of measuring the positions of the stages may be adapted to any appropriate manner and is not limited specifically to an interferometer measuring system. Therefore, the spirit and scope of the appended claims should not be limited to the description of the versions depicted in the figures.

What is claimed is:

1. A positioning apparatus comprising:
    a first stage;
    a position measurement system positioned near the first stage, said position measurement system providing a first stage position signal corresponding to the position of said first stage;
    a fine stage positioned above the first stage and coupled to at least one actuator, wherein said at least one actuator moves said fine stage in approximate synchronization with said first stage;
    a second position measurement system positioned near the fine stare, said second position measurement system providing a fine stage position signal corresponding to the position of said fine stage; and
    a fine stage controller connected with at least one actuator and receiving a fine stage trajectory command signal proportional to said first stage position signal, said fine stage controller generating a positional error signal corresponding to a position of the center of said fine stage and controlling said at least one actuator in response to said positional error signal for said center of said fine stage.

2. The positioning apparatus of claim 1, wherein a multiplier circuit is disposed between said first stage position measurement system and said fine stage controller, said multiplier circuit generating said fine stage trajectory command signal by multiplying said first stage position signal by a desired reduction ratio.

3. The positioning apparatus of claim 1, further comprising a coarse stage, wherein said fine stage is movably coupled to said coarse stage.

4. The positioning apparatus of claim 1, wherein said fine stage controller comprises:
    a position feedback loop combining said fine stage position signal and said fine stage trajectory command signal to produce a synchronous error signal reflecting the difference between said position of said first stage and said position of said fine stage;

a coordinate transformation circuit converting said synchronous error signal into said positional error signal for said center of said fine stage;

a controller filter circuit receiving said positional error signal corresponding to a position of said center of said fine stage and in response generating a force signal;

a force coordinate transformation circuit converting said force signal into a command signal to control said at least one actuator; and an amplifier circuit driven by said command signal, said amplifier circuit generating a control signal controlling said at least one actuator.

5. The positioning apparatus of claim 4, further comprising a feedforward loop, said feedforward loop providing a feedforward force signal in response to said fine stage trajectory command signal, wherein said feedforward force signal is sunned with said force signal provided by said controller filter circuit, and said force coordinate transformation circuit converts the sum of said force signal and said feedforward force signal into said command signal.

6. The positioning apparatus of claim 5, said feedforward loop comprising:

a differentiation circuit receiving said first stage position signal, said differentiation circuit providing an acceleration signal equivalent to the second derivative of said fine stage trajectory command signalwith respect to time;

a feedforward gain circuit receiving said acceleration signal and in response providing a first feedforward force signal;

a second force coordinate transformation circuit converting said feedforward force signal into a second feedforward force signal reflecting the feedforward force on said center of said fine stage.

7. The positioning apparatus of claim 4, wherein said second position measurement system measures the differential position of said fine stage using a first measurement point on said fine stage to measure the position of said fine stage in a first coordinate direction, a second measurement point on said fine stage to measure the position of the left side of said fine stage in a second coordinate direction, and a third measurement point to measure the position of the right side of said fine stage in said second coordinate direction, said second coordinate direction being orthogonal to said first coordinate direction.

8. The positioning apparatus of claim 7, wherein said coordinate transformation circuit is a differential Jacobian coordinate transformation circuit, said Jacobian coordinate transformation circuit converting said synchronous error signal into said positional error signal for said center of said fine stage according to the following equation:

$$\begin{bmatrix} \Delta x \\ \Delta y \\ \Delta \Theta \end{bmatrix} = \begin{bmatrix} 1 & -\frac{\tilde{y}}{l} & \frac{\tilde{y}}{l} \\ 0 & \frac{b}{l} & \frac{a}{l} \\ 0 & -\frac{1}{l} & \frac{1}{l} \end{bmatrix} \begin{bmatrix} \Delta R_x \\ \Delta R_l \\ \Delta R_r \end{bmatrix}$$

where the terms $\Delta x$, $\Delta y$, and $\Delta \Theta$ are the positional error of said center of said fine stage, the terms $\Delta R_X$, $\Delta R_l$, and $\Delta R_r$ are the synchronous error of said fine stage in the respective first coordinate direction, the right side of said fine stage in said second coordinate direction, and the left side of said fine stage in said second coordinate direction, $\tilde{y}$ is the distance in the second coordinate direction between the measuring point used for the $\Delta R_X$ term and the center line of said fine stage in said first coordinate direction, a and b are the distances from the measuring point used for the respective $\Delta R_l$ and $\Delta R_r$ terms and said center line of said fine stage in the second coordinate direction, and the term 1 is the sum of the a and b terms.

9. The positioning apparatus of claim 4, wherein said controller filter circuit includes a saturation limited integration term.

10. The positioning apparatus of claim 9, wherein said saturation limited integration term is in accordance with the following:

$$I\Delta X = \begin{cases} \frac{Ki}{s}\Delta X, \text{ when } \left|\frac{Ki}{s}\Delta X\right| < C \\ C, \text{ when } \frac{Ki}{s}\Delta X \geq C \\ -C, \text{ when } \frac{Ki}{s}\Delta X \leq -C \end{cases}$$

where I represents the integration function, $\Delta X$ is the positional error term for said center of said fine stage, Ki/s is the integral with respect to time, and C is a constant.

11. The positioning apparatus of claim 1, wherein said center of said fine stage is the center of gravity of said fine stage.

12. A method of controlling a fine stage to move synchronously with a first stage, said method comprising:

controlling the motion of said first stage;

providing a fine stage trajectory command signal that is proportional to the position of said first stage;

providing a fine stage position signal corresponding to the position of said fine stage;

generating a synchronous error signal equivalent to the difference between said fine stage trajectory command signal and said fine stage position signal; and controlling the motion of said fine stage in response to said synchronous error signal, wherein said controlling the motion of said fine stage comprises:

transforming said synchronous error signal into a positional error signal for the center of said fine stage;

filtering said positional error signal to generate a force signal for said center of said fine stage; and transforming said force signal for said center of said fine stage into a command signal to control the motion of said fine stage.

13. The method of claim 12, further comprising:

generating a feedforward force signal in response to said fine stage trajectory command signal; and summing said force signal and said feedforward force signal;

wherein said transforming said force signal comprises transforming the sum of said force signal and said feedforward force signal into said command signal to control the motion of said fine stage.

14. The method of claim 12, wherein transforming said synchronous error signal into said positional error signal is performed with a Jacobian differential coordinate transformation.

15. The method of claim 14, wherein said Jacobian differential coordinate transformation is in accordance with the following equation:

$$\Delta X = \begin{bmatrix} 1 & -\frac{\tilde{y}}{l} & \frac{\tilde{y}}{l} \\ 0 & \frac{b}{l} & \frac{a}{l} \\ 0 & -\frac{1}{l} & \frac{1}{l} \end{bmatrix} \Delta R$$

where ΔX is equivalent to the positional error for said center of said fine stage, ΔR is equivalent to the synchronous error, ỹ is a distance in a first coordinate direction between a first measuring point used in providing said fine stage position signal and a first center line of said fine stage in a second coordinate direction, a and b are the distances in a second coordinate direction between a second measuring position and a third measuring point, respectively, and a second center line of said fine stage in said first coordinate direction, and l is the sum of a and b, wherein said first coordinate direction and said second coordinate direction are orthogonal.

16. The method of claim 12, wherein said filtering said positional error signal to generate a force signal for said center of said fine stage comprises integrating said positional error signal wherein the result is saturation limited in accordance with the following:

$$I\Delta X = \begin{cases} \frac{Ki}{s} \Delta X, & \text{when } \left|\frac{Ki}{s}\Delta X\right| < C \\ C, & \text{when } \frac{Ki}{s}\Delta X \geq C \\ -C, & \text{when } \frac{Ki}{s}\Delta X \leq -C \end{cases}$$

where I represents the integral function, ΔX represents the positional error of said center of said fine stage, Ki/s is the integration result, and C is a chosen constant.

17. The method of claim 12, further comprising
amplifying said command signal into a current signal; and
energizing at least one actuator coupled to said fine stage to generate motion of said fine stage.

18. A positioning apparatus comprising:
a first stage coupled to at least one actuator;
a first stage position measurement apparatus measuring an off-center differential position of said first stage and producing a first stage position signal;
a first stage control circuit receiving a is first stage trajectory command signal, said first stage control circuit comprising:
  a position feedback loop providing said first stage position signal to be combined with said first stage trajectory command signal and generating a synchronous error signal reflecting the synchronous error between said off-center differential position of said first stage and said first stage trajectory command signal;
  a differential coordinate transformation circuit receiving said synchronous error signal and transforming said synchronous error signal into a positional error signal reflecting the positional error of the center of said first stage relative to said first stage trajectory command signal;
  a controller filter circuit receiving said positional error signal and generating a force signal reflecting a force on said center of said first stage to minimize said positional error; and
  a force coordinate transformation circuit receiving said force signal and generating a command signal to said at least one actuator.

19. The positioning apparatus of claim 18, further comprising a second stage, wherein said first stage trajectory command signal is proportional to the position of said second stage and said first stage is moved by said at least one actuator in synchronization with said second stage.

20. The positioning apparatus of claim 18, wherein said differential coordinate transformation circuit uses a Jacobian differential transformation.

* * * * *

UNITED STATES PATENT AND TRADEMARK OFFICE
CERTIFICATE OF CORRECTION

PATENT NO. : 6,260,282 B1
DATED : July 17, 2001
INVENTOR(S) : Yuan et al.

It is certified that error appears in the above-identified patent and that said Letters Patent is hereby corrected as shown below:

Column 1,
Line 20, please delete "direction .s" and insert -- directions --;

Column 4,
Line 13, after "the" delete "E)" and insert symbol -- $\Theta$ --;

Column 5,
Line 28, please delete "With" and insert -- with --;

Column 6,
Line 64, please delete "Lx" and insert -- $L_x$ --;

Column 9,
Line 13, please delete "AR" and insert -- $\Delta R$ --;
Line 31, after "synchronous" please delete "M";

Column 10,
Line 12, please delete "0" and insert symbol -- $\Theta$ --;

Column 12,
Line 41, please delete "stare" and insert -- stage --;

Column 13,
Line 17, please delete "sunned" and insert -- summed --; and

Column 16,
Line 7, after "a" delete "is".

Signed and Sealed this

Tenth Day of December, 2002

JAMES E. ROGAN
*Director of the United States Patent and Trademark Office*